United States Patent [19]

Magdo et al.

[11] 4,002,511
[45] Jan. 11, 1977

[54] METHOD FOR FORMING MASKS COMPRISING SILICON NITRIDE AND NOVEL MASK STRUCTURES PRODUCED THEREBY

[75] Inventors: Ingrid E. Magdo; Steven Magdo, both of Hopewell Junction, N.Y.

[73] Assignee: IBM Corporation, Armonk, N.Y.

[22] Filed: Apr. 16, 1975

[21] Appl. No.: 568,546

[52] U.S. Cl. .............................. 148/187; 148/1.5; 148/175; 148/33.3; 357/49
[51] Int. Cl.² ........................................ H01L 21/308
[58] Field of Search .......... 148/187, 1.5, 175, 33.3; 357/49

[56] References Cited

UNITED STATES PATENTS

| | | | |
|---|---|---|---|
| 3,664,896 | 5/1972 | Duncan | 148/187 |
| 3,771,218 | 11/1973 | Langdon | 148/187 X |
| 3,783,047 | 1/1974 | Paffen et al. | 148/187 |

OTHER PUBLICATIONS

Anantha, "Contact Opening in Shallow Junction Transistors", IBM Tech. Disc. Bull., vol. 11, No. 7, Dec. 1968, p. 857.

*Primary Examiner*—L. Dewayne Rutledge
*Assistant Examiner*—Davis J. M.
*Attorney, Agent, or Firm*—J. B. Kraft

[57] ABSTRACT

In the fabrication of integrated circuits, a method is provided for forming masking structures comprising silicon nitride which avoids the stresses and dislocations associated with direct silicon nitride masking as well as the "bird's beak" problems associated with silicon dioxidesilicon nitride composite mask structures. The mask is formed by first forming a silicon dioxide mask having at least one opening through which the substrate is exposed. Then, a mask comprising silicon nitride is formed on the first mask; this mask has at least one opening laterally smaller than the openings in the first mask and respectively in registration with at least some of the openings in said first mask. Thus, the second mask contacts and covers a portion of the exposed silicon substrate under each of the registered openings.

The masked silicon substrate is subjected to a processing step such as oxidation, etching or diffusion which alters the characteristics of those portions of the silicon substrate remaining exposed. During this processing step a second mask serves as a barrier mask.

9 Claims, 9 Drawing Figures 4,002,511

METHOD FOR FORMING MASKS COMPRISING SILICON NITRIDE AND NOVEL MASK STRUCTURES PRODUCED THEREBY

BACKGROUND OF INVENTION

In recent years, silicon nitride masks have become a sought-after expedient in the fabrication of integrated circuits. Originally, the art applied masking layers comprising silicon nitride directly onto silicon substrates. This gave rise to problems associated with high stresses created on the underlying silicon substrate by the silicon nitride-silicon interface. Such stresses were found in many cases to produce dislocations in the silicon substrate which appear to result in undesirable leakage current, pipes and otherwise adversely affect the electrical characteristics of the interface. In order to minimize such interface stresses with silicon nitride layers, it has become the practice in the art to form a thin layer of silicon dioxide between the silicon substrate and the silicon nitride layer. While this approach has been relatively effective in the cases where this silicon dioxide-silicon nitride composite is utilized only for passivation, problems have arisen where these silicon dioxide-silicon nitride composites have been utilized as masks, and, particularly, when utilized as masks against thermal oxidation. During such thermal oxidation, there is a substantial additional lateral penetration of silicon oxide from the thermal oxidation beneath the silicon nitride. This lateral penetration is greatest at the mask-substrate interface to provide a laterally sloping structure known and recognized in the prior art as the undesirable bird's beak which warps and lifts the silicon nitride layer over it. If a recess has been etched in the silicon being oxidized through the mask, then, the beak is combined with a bump extending in the order of 4,000 to 5,000 A above the silicon-mask interface to produce the undesirable structure known and recognized in the prior art as the bird's head.

The publications, "Local Oxidation of Silicon; New Technological Aspects," by J. A. Appels et al, Phillips Research Report 26, pp. 157 – 165, June 1971, and "Selective Oxidation of Silicon and Its Device Application," E. Kooi et al, *Semiconductor silicon* 1973, published by the Electrochemical Society, Edited by H. R. Huff and R. R. Burgess, pp. 860 – 879, are representative of the recognition in the prior art of the stress problems associated with directly applied silicon nitride masking layers as well as the bird's beak and bird's head problems associated with silicon dioxide-silicon nitride composite masks.

The bird's beak and bird's head problems are particularly significant when silicon dioxide-silicon nitride composite masks are used in the formation of recessed silicon dioxide to be used for dielectric isolation. In such recessed oxide formation techniques, the silicon dioxide-silicon nitride composite masks are first used as an etch barrier while recesses are etched through the mask openings in the silicon substrate. These recesses are subsequently subjected to the previously described thermal oxidation to form recessed silicon dioxide regions providing dielectric isolation extending into the silicon substrate from the surface. Such recessed silicon dioxide regions would be most desirably coplanar with the remainder of the silicon surface. However, because of the bird's head, an undesirable bump in the order of from 4,000 to 5,000 A in height is present at the surface, but even more significantly, as a result of the bird's beak, a lateral junction or edge of the recessed silicon dioxide isolation region is very vaguely defined. With any recessed oxide isolation it is highly desirable that the lateral edges of the recessed silicon dioxide be substantially vertical, i.e., perpendicular to the semiconductor substrate surface. Instead, as a result of the bird's beak, the edges of the recessed silicon dioxide are gradually sloped with respect to the silicon surface, being at an angle which varies from 15° to 30° with respect to the surface instead of the desirable 90° angle.

Because of this gradual lateral junction in the recessed silicon dioxide, the recessed area does not definitely define abutting regions introduced by either diffusion or ion implantation, particularly shallow abutting regions. In the case of such shallow abutting regions, there is a distinct possibility that during subsequent etching steps part of the bird's beak at the surface will be etched away to provide an undesirable exposure of the P-N or other junction of the abutting shallow region. However, even with deeper regions formed by diffusion, the indefiniteness of the lateral junction of the abutting recessed silicon dioxide region renders it difficult to control lateral geometries of introduced region, and therefore imposes the need for wider tolerances of lateral dimension in the integrated circuit layout.

In addition, during the formation of contact openings to the substrate, there is a distinct possibility that portions of the recessed silicon dioxide near the surface will be etched away to expose silicon portions that are curved or slanted rather than planar. In this connection, in methods and structures such as that defined in our patent, U. S. Pat. No. 3,858,231, where the recessed silicon dioxide is used to define the area of a Schottky barrier contact with the silicon substrate, it is particularly desirable that the recessed oxide abutting the contact opening has lateral sides substantially perpendicular to the semiconductor surface; otherwise, i.e., in the case of a bird's beak, the Schottky barrier contact would be formed with a silicon substrate having a sloped portion. In order to ensure complete elimination of the edge effect problems described in said patent, it is most desirable that the silicon surface to which the Schottky barrier contact is made is substantially flat and coplanar with the recessed silicon dioxide region.

In addition to the bird's beak and bird's head problems described above, the art has also been aware of a lesser problem with silicon dioxide-silicon nitride composite masks involving the undercutting of the silicon dioxide during the etching of openings in the bottom silicon dioxide layer corresponding to the openings previously formed through the silicon nitride layer. Accordingly, the dimensions of the openings in the bottom layer are less definite, and changes in the silicon substrate due to processing through the mask, e.g., diffusion or etching become more difficult to define.

SUMMARY OF THE PRESENT INVENTION

Accordingly, it is an object of the present invention to provide a method of forming a silicon nitride mask structure which is not subject to the stress and dislocation problems involved in silicon nitride masking of silicon substrates but avoids the bird's beak and bird's head problem.

It is another object of the present invention to provide a method of forming silicon nitride mask structures on silicon substrates which is not subject to the above described stress and dislocation problems but still avoids the undercutting problems of silicon dioxide-silicon nitride composite masks.

It is a further object of the present invention to provide a method of forming integrated circuits dielectrically isolated with recessed silicon dioxide which is not subject to the bird's beak and bird's head problems, and still avoids the stress and dislocation problems in the silicon substrate as described above.

It is yet another object of the present invention to provide a method for forming integrated circuits dielectrically isolated with recessed silicon dioxide regions having lateral walls substantially perpendicular to the silicon surface from which recessed oxide regions extend into the substrate.

It is yet a further object of the present invention to provide a method for forming such recessed silicon dioxide regions in a silicon substrate wherein the extension of the recessed oxide above the substrate surface as bumps is minimized.

In accordance with the method of the present invention, the mask structure on the silicon substrate is formed in the following manner. First, there is formed on the silicon substrate a first mask comprising silicon dioxide having at least one opening exposing the substrate. Then, there is formed on this first mask, a mask comprising silicon nitride having at least one opening laterally smaller than said at least one opening in the first mask and respectively in registration with one or more of the openings in the first mask. In this manner, the second mask contacts and covers a portion of the exposed silicon substrate under each of the registered openings.

The masked silicon substrate is then subjected to any processing step in which the composite mask serves as a barrier in a process which alters characteristics of the portions of the silicon substrate exposed through the registered openings.

We have surprisingly found that the composite silicon dioxide-silicon nitride mask produced by the method of the present invention substantially eliminates the bird's beak and bird's head problems when utilized as a thermal oxidation mask, and also eliminates the previously mentioned silicon dioxide undercutting problem. As will be hereinafter described in greater detail, the elimination of these problems is directly attributable to smaller openings in the silicon nitride mask resulting in what essentially is a frame of silicon nitride in direct contact with silicon substrate along the periphery of the registered openings between the silicon dioxide and silicon nitride masks. It is the presence of silicon dioxide along these peripheries in the prior art composite silicon dioxide-silicon nitride structures which appear to be the prime cause for the bird's beak, bird's head and silicon dioxide undercutting problems.

In addition, we have also surprisingly found that the mask structures produced by the method of the present invention are not subject to the stresses and the stress-induced dislocations of the prior art masking structures wherein a silicon nitride mask is formed directly on the silicon substrate. In the structures of the present invention, the silicon dioxide portion of the mask is in contact with most of the silicon substrate and is, or course, relatively free of stress. Surprisingly, the relatively small area of the silicon nitride portion of the mask in direct contact with the substrate along the periphery of the opening is also relatively free of stress.

This freedom from stress is confirmed by the fact that integrated circuit devices formed utilizing the masking method of the present invention display electrical characteristics similar to devices produced by the stress-free silicon dioxide-silicon nitride composite mask in the prior art rather than characteristics of the stress-burdened directly applied silicon nitride masking methods of the prior art.

In addition to serving as barrier masks during the thermal oxidation of the exposed portions of the substrate, as in the formation of recessed silicon dioxide dielectric isolation, the composite masks formed by the present invention may be also utilized as masks during the selective introduction of impurities into the substrate through the registered openings to form regions of selected conductivity types in a substrate. These impurities may be introduced either by diffusion or ion implantation.

Also, composite masks of the present invention may be utilized as barrier masks during the etching of the silicon substrate exposed in the openings either by chemical etching or by glow discharge sputter etching.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Figure 1:
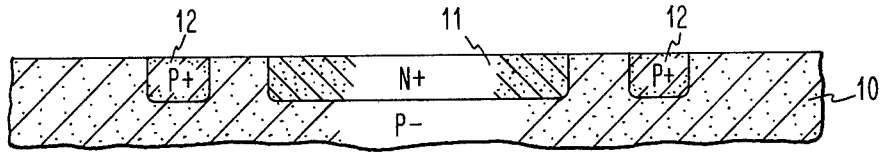
FIGS. 1 – 7 are diagrammatic section views of a portion of an integrated circuit in order to illustrate the method of masking set forth in the preferred embodiment of the present invention.

FIGS. 1 – 7 illustrate the preferred embodiment of the present invention in forming a mask which is used in the subsequent formation of recessed silicon dioxide by thermal oxidation. The resulting recessed silicon dioxide does not have a bird's beak or bird's head problem. In a suitable wafer 10 of P- material, i.e., a silicon substrate having a resistivity of 10 ohm-cm, N+ region 11 is formed utilizing conventional photolithographic masking techniques involving a standard silicon oxide masking of the surface of the substrate. The region may be formed by any conventional ion implantation or thermal diffusion of impurities such as phosphorus, arsenic, antimony or the like, to an N+ surface concentration of $10^{21}$ atoms/cm$^3$. By similar techniques, P+ region 12 is formed surrounding region 11. The conductivity-determining impurity in region 12 may be a material such as boron or gallium having an approximate $C_0$ of $5 \times 10^{19}$ atoms/cm$^3$. The structure at this stage is shown in FIG. 1.

In this connection, it should be noted that the structure being shown and described is only a small portion of an integrated circuit and is intended to illustrate how the masking method of the present invention is operable to fabricate recessed silicon dioxide regions which dielectrically isolate regions in a silicon substrate. Except for the method of mask formation and the novel mask structure, the techniques utilized to form the recessed silicon dioxide dielectrically isolated integrated circuit are substantially described in our patent, U.S. Pat. No. 3,858,231.

Figure 2:
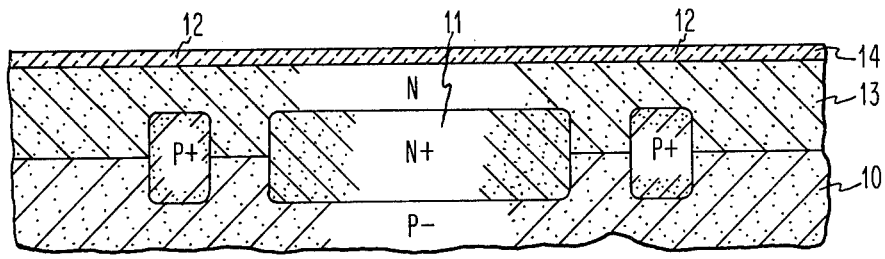

Now, with reference to FIG. 2, there is then formed on substrate 10 an N-type epitaxial layer 13 having a maximum impurity concentration of doping level of about $10^{16}$ atoms/cm$^3$ by conventional epitaxial deposition techniques having temperature in the order of 950° to 1150° C over a period of from fifteen to thirty minutes. During the deposition of epitaxial layer 13, regions 11 and 12 are out-diffused partially up into this layer. The epitaxial layer has a thickness in the order of from 1 to 4 microns, depending on the overall specifications of the integrated circuits. For purposes of the present invention, the thickness of the epitaxial layer is 2 microns. The epitaxial layer may be formed using the apparatus and method described in U.S. Pat. No. 3,424,629. A layer of silicon dioxide 14 of about 1000 A is first formed on the surface of epitaxial layer 13. Layer 14 may be formed by any conventional thermal oxidation technique or it may be deposited by conventional vapor deposition techniques.

Figure 3:
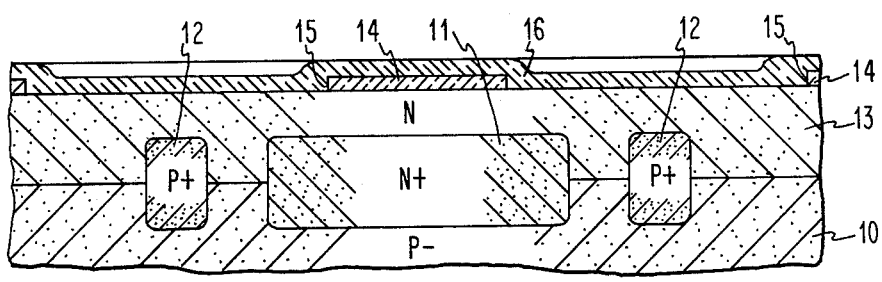

Next, FIG. 3, utilizing suitable conventional photoresist techniques, openings 15 are etched through silicon dioxide layer 14. A suitable etchant for this silicon dioxide is buffered hydrofluoric acid. In a silicon dioxide layer having a thickness in the order of 1000 A, openings 15 have lateral dimension in the order of 10 microns which is about 3 microns larger than the final opening to be hereafter formed.

Figure 4:
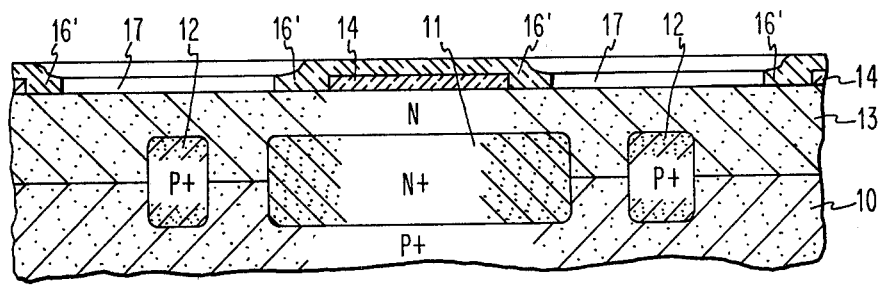

Next, a layer comprising silicon nitride 16 having a thickness of 1,000 A is deposited over the entire structure, and as shown, directly on the surface of the silicon epitaxial layer 13 exposed in openings 15. Silicon nitride layer 16 can be formed by any conventional technique such as the chemical vapor deposition reaction of silane and ammonia. This reaction is normally carried out at a temperature in the order of 1,000° C. Alternatively, silicon nitride layer 16 may be deposited by conventional RF sputter deposition techniques. While layer 16 is preferably formed of silicon nitride alone, it may also have a composition which is predominantly silicon nitride together with small amounts of silicon oxide or dioxide;

Next, FIG. 4, utilizing standard photolithographic etching techniques, openings 17 which are smaller than and in registration with openings 15 are etched through that portion of silicon nitride layer 16 deposited within openings 15. One conventional technique for etching openings 17 through the silicon nitride layer involves forming by standard photoresist methods a deposited silicon dioxide mask (not shown) over silicon nitride layer 16 defining openings 17, and etching with a suitable etchant for silicon nitride such as hot phosphoric acid or hot phosphoric salt. The silicon dioxide mask (not shown) for the silicon nitride layer is then removed leaving the structure shown in FIG. 4.

Because openings 17 are smaller than openings 15, a small portion of the silicon nitride layer 16' remains in direct contact with the surface of the silicon epitaxial layer 13 framing the periphery of openings 17. The lateral dimensions have been exaggerated in order to illustrate the present invention. As will be hereinafter described, upon the completion of the masking process wherein the present structure serves as the mask for the formation of the recessed silicon dioxide, silicon nitride layer portions 16' will only be in contact with up to about 5 – 10% of the total area of the surface of silicon layer 13.

Figure 5:
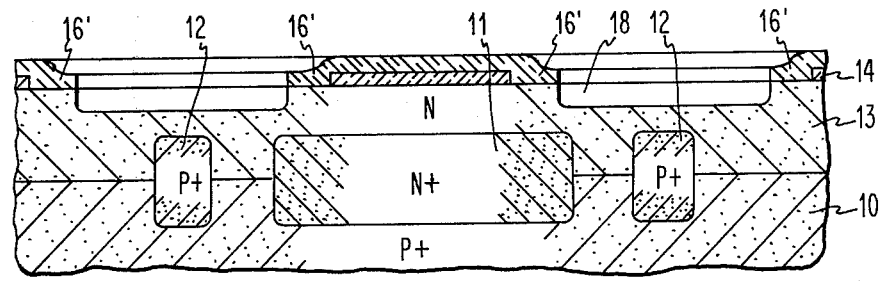
Figure 6:
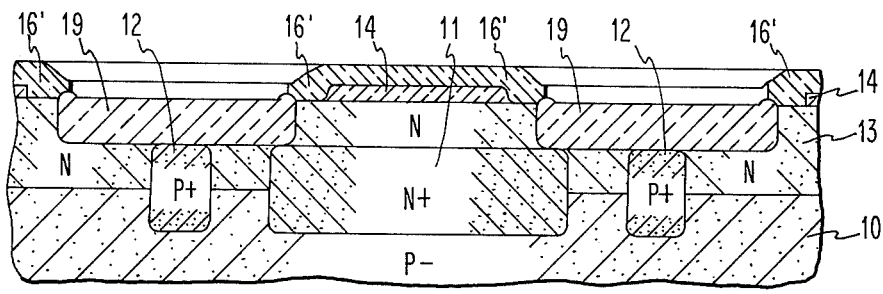

Next, as shown in FIG. 5, the composite of silicon oxide mask 14 and silicon nitride mask 16 is utilized as a mask, and epitaxial layer 13 is partially etched away in regions 18, utilizing a conventional etchant for silicon such as a composition of nitric acid and diluted hydrofluoric acid. Openings 18 are about 0.4 microns in depth resulting in the mesa-like structure shown. The structure is then put through an oxidation cycle wherein it is placed in an oxidation atmosphere at an elevated temperature, in the order of 970° C to 1100° C with the addition of water to produce silicon dioxide recessed regions 19, as shown in FIG. 6, which extends substantially from the upper surface of epitaxial layer 13 to out-diffused region 12. The oxidation is continued until regions 19 are substantially coplanar with the surface of remaining epitaxial layer 13. It should be noted that a portion of silicon epitaxial layer 13 is consumed in the oxidation process, thereby permitting silicon dioxide regions 19 to extend down to P+ regions 12. In order that the oxidation to form regions 19 be carried out so as the oxidation reaches underlying P+ regions 12 at approximately the same time as the oxidation reaches the surface of epitaxial layer 13, etched recesses 17 must be etched with depth about half-way between the surface of epitaxial layer 13 and the points to which P+ regions 12 have out-diffused.

Recessed silicon dioxide regions 19 are free from both the bird's beak and bird's head problems encountered by recessed silicon dioxide structures of the prior art which utilize more conventional silicon dioxide-silicon nitride composite masks.

Figure 6A:
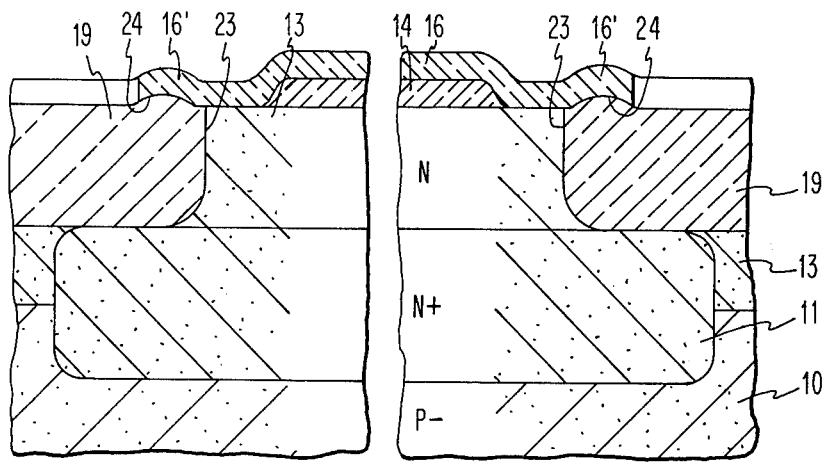
FIG. 6A is an enlarged view of a portion of FIG. 6 to better illustrate the absence of bird's beak and bird's head in the structure.
Figure 6B:
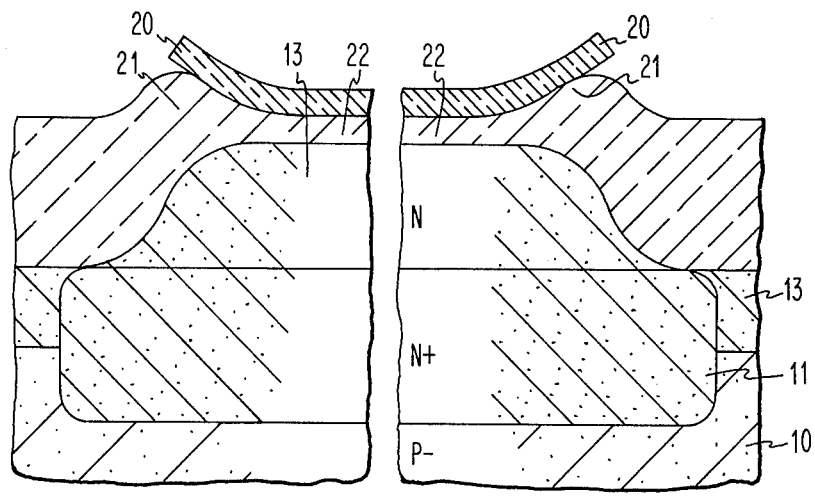
FIG. 6B is a view similar to that of 6A but of a structure produced by a silicon dioxide-silicon nitride masking method of the prior art which is subject to the bird's beak and bird's head problems.

In order to illustrate the differences between the recessed silicon dioxide structures produced in the present method as compared to those of the prior art, reference is made to FIG. 6A which is an enlarged view of a portion of FIG. 6 in order to more clearly show the structure of the lateral wall recessed silicon dioxide regions 19 in a structure produced in accordance with the method of the present invention as compared to the structure of FIG. 6B which represents a similar recessed silicon dioxide structure produced by prior art methods in which the silicon nitride layer 20 does not extend into contact with the surface of epitaxial layer 13. In such a structure, as has been recognized by the prior art, bird's heads 21 form as shown and include bird's beaks 22 which collectively act to lift the silicon nitride layer upwardly as shown.

In the present structure, shown in FIG. 6A, the lateral walls 23 of the recessed silicon dioxide area 19 are substantially perpendicular to the surface of epitaxial layer 13. Instead of the bird's beak, the present structures display a slight bump 24, in the order of 1,000 A or less as compared with the bird's head of the prior art structure in FIG. 6B which extends in the order of from 4,000 A to 5,000 A above the substrate. Without again going into the various problems present by the bird's beak and bird's head, it is clear that the method of the present invention eliminates such problems.

As we have previously set forth, portions 16' of the silicon nitride layer 16 which extended into contact with surface epitaxial layer 13 in the structures of the present invention appear to be substantially free of the stress problems associated with prior art methods wherein silicon nitride layer is in direct and continuous contact with the substrate. Consequently, the surface of epitaxial layer 13 appears to be substantially free of any dislocations introduced by such stress. The absence of such dislocations has been confirmed by electrical tests performed on devices such as bipolar transistors formed within an epitaxial layer defined and dielectrically isolated by recessed oxide regions 19 made in accordance with the present invention. Electrical parameters such as collector to emitter breakdown voltage (base open), emitter-base leakage current and Beta which are normally indicative of stress-induced dislocation have been found to be substantially unchanged as compared to structures utilizing conventional silicon dioxide-silicon nitride composite masks.

We believe that an explanation as to why the relatively small areas of silicon nitride, 16' in direct contact with the substrate do not induce the usual stresses associated with the silicon nitride, silicon interface is related to a balancing of stresses. Generally, a silicon dioxide layer on a substrate induces a compressive stress on the substrate. On the other hand, the silicon nitride layer in contact with the substrate induces a tensile stress with respect to the same substrate. Since the tensile and compressive stresses seem to operate opposite to each other, the compressive stress with a relatively extensive silicon dioxide material in contact with the substrate appears to offset any tensile stress created by the relatively small area of silicon nitride in contact with the substrate.

The tensile stress per unit surface area created by a conventionally deposited silicon nitride layer with respect to the substrate is approximately in the order of from 10 times the compressive stress per unit area created by a silicon dioxide layer. Accordingly, if, as in the present embodiment, the silicon nitride portions 16' are in contact with 5 – 10% of the total surface area and the silicon dioxide in contact with the remainder, the result would be substantially a neutralization or compensation of stresses. This would result in a structure in which the effect of stress would be even less than that of the conventional silicon dioxide-silicon nitride composite masks having only the silicon oxide in contact with the silicon substrate.

Figure 7:
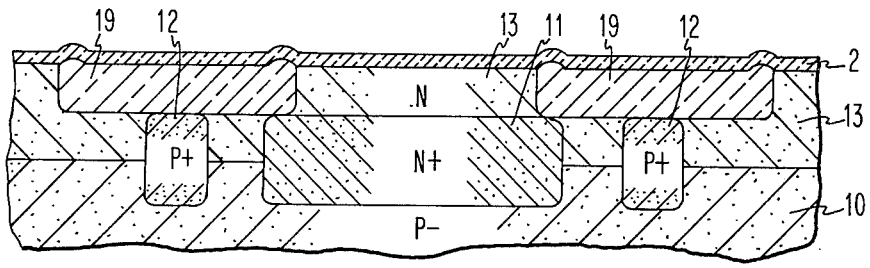

After completion of regions 19, the composite masking structure including silicon dioxide layer 14 and silicon nitride 16 are removed utilizing any of the conventional techniques for removal of such layers, and a layer of dielectric material 25 is formed completely covering the planar surface of epitaxial layer 13. Dielectric layer 25 may be silicon dioxide deposited by any of the previously described deposition techniques or it may be a composite of a silicon dioxide bottom layer and a silicon nitride top layer. This structure is shown in FIG. 7. Subsequently, using standard integrated circuit fabrication techniques suitable devices may be formed within the pockets 26 of N-type epitaxial layer 13 laterally enclosed by recessed silicon dioxide regions 19. These techniques, of course include diffusion and ion implantation of regions of which the lateral junctions will now be clearly defined by the vertical side walls of recessed silicon dioxide regions 19. Appropriate metallization layers may then be formed in accordance with the conventional integrated circuit fabrication techniques to provide interconnections between devices in the integrated circuit. Contact openings which will be subsequently formed through layer 25 connecting such metallization to regions in the substrate will now be more readily definable and will not be subjected to previously mentioned problems associated with bird's beak and bird's head.

It will, of course, be understood that a wide variety of integrated circuit masking techniques in addition to those described above in the specific embodiment may be performed utilizing the masking methods and structures of the present invention. For instance, instead of forming P+ regions 12 by out-diffusion from substrate 10 into the epitaxial layer as described above, regions 12 may be eliminated from FIG. 1, and the isolation regions formed through the introduction of P-type impurities (not shown) into the etched recesses 18, FIG. 5, prior to the thermal oxidation of FIG. 6 to form silicon dioxide recessed regions 19. In this manner, the P+ impurities introduced into etched regions 18 will be driven-in, during the thermal oxidation step of FIG. 6, across the interface between substrate 10 and epitaxial layer 13 to provide P+ junction isolation.

Also, for certain purposes it may be desirable to selectively diffuse through silicon dioxide recessed regions 19, FIG. 6, subsequent to the formation of these regions, e.g., it may be desirable to form a thin P-type skin in epitaxial layer 13 abutting the side walls of silicon dioxide regions 19 in order to prevent inversion. This may be readily accomplished after the completion of a structure shown in Fig. 6 by subjecting the structure to a gallium diffusion ambient. In such an environment, silicon nitride masks 16 will block gallium atoms which will be only able to diffuse through silicon dioxide recessed regions 19 to form the thin skin (not shown) along their side walls.

Another advantage of the composite masking structure formed by the method of the present invention is that silicon nitride extensions 16' protect the sides of underlying silicon dioxide layer 14 from undercutting during mask formation.

While the present invention has been described with respect to composite masking methods wherein silicon nitride mask is formed over a silicon dioxide mask, the general principals of the present invention are also applicable to composite masking structures wherein mask 16 and extension 16' in contact with the epitaxial layer are formed of aluminum oxide. In such a case, the method of the present invention should eliminate bird's head and bird's beak problems while still minimizing any of the stresses or dislocations associated with aluminum oxide masks in continuous direct contact with a silicon substrate.

While the invention has been particularly shown and described with reference to the preferred embodiment thereof, it will be understood by those skilled in the art that various changes in form and details may be made therein without departing from the spirit and scope of the invention.

What is claimed is:

1. In the fabrication of integrated circuits, a method for altering the characteristics of exposed portions in a masked silicon substrate comprising forming a first mask comprising silicon dioxide on said silicon substrate having at least one opening exposing the substrate, forming on said first mask, a mask comprising silicon nitride having at least one opening laterally smaller than said at least one opening in said first mask and respectively in registration with at least one opening in said first mask whereby said second mask contacts and covers a portion of said exposed silicon substrate under said at least one registered opening, and thermally oxidizing the substrate remaining exposed in said at least one opening to convert the exposed silicon into silicon dioxide recessed into said substrate.

2. The method of claim 1 wherein, prior to said thermal oxidation, a recess is etched into said exposed substrate so that when said substrate is oxidized, the recessed silicon dioxide will be substantially coplanar with the masked portions of said substrate.

3. The method of claim 2 including the additional processing step of introducing into the substrate conductivity-determining impurities which pass through the recessed silicon dioxide region into the substrate region adjoining said silicon dioxide regions but which are blocked by said second mask from other portions of said silicon substrate.

4. The method of claim 3 wherein said conductivity-determining impurity is gallium, and said impurity is introduced by diffusion.

5. The method of claim 1 wherein the entire surface of the silicon substrate on which said first mask is formed is of one conductivity type.

6. In the fabrication of integrated circuits, a method for altering the characteristics of exposed portions in a masked silicon substrate comprising forming a first mask comprising silicon dioxide on said silicon substrate having at least one opening exposing the substrate, forming on said first mask, a mask comprising aluminum oxide having at least one opening laterally smaller than said at least one opening in said first mask and respectively in registration with at least one opening in said first mask whereby said second mask contacts and covers a portion of said exposed silicon substrate under said at least one registered opening, and thermally oxidizing the substrate remaining exposed in said at least one opening to convert the exposed silicon into silicon dioxide recessed into said substrate.

7. The method of claim 6 wherein the entire surface of the silicon substrate on which said first mask is formed is of one conductivity type.

8. An integrated circuit structure comprising a substrate, a silicon dioxide layer on said substrate having a plurality of openings therein exposing said substrate, a layer comprising silicon nitride formed on said silicon dioxide layer having a plurality of openings laterally smaller than the openings in said silicon dioxide layer and respectively in fully enclosed registration with at least some of the openings in said silicon dioxide layer, whereby said layer comprising silicon nitride contacts and covers a portion of said exposed substrate under each of the registered openings, and regions of recessed silicon dioxide formed in the exposed portions of said substrate under each of said registered openings, said substrate further comprising silicon surrounding and coplanar with said recessed silicon dioxide regions.

9. An integrated circuit structure comprising a substrate, a silicon dioxide layer on said substrate having a plurality of openings therein exposing said substrate, a layer comprising aluminum oxide formed on said silicon dioxide layer having a plurality of openings laterally smaller than the openings in said silicon dioxide layer and respectively in fully enclosed registration with at least some of the openings in said silicon dioxide layer, whereby said layer comprising aluminum oxide contacts and covers a portion of said exposed substrate under each of the registered openings, and regions of recessed silicon dioxide formed in the exposed portions of said substrate under each of said registered openings, said substrate further comprising silicon surrounding and coplanar with said recessed silicon dioxide regions.

* * * * *